United States Patent
Kahmen (10) Patent No.: US 9,673,756 B2
(45) Date of Patent: Jun. 6, 2017

(54) PHASE-LOCKED LOOP WITH A VARACTOR BASED ON MEMS TECHNOLOGY

(71) Applicant: Rohde & Schwarz GmbH & Co. KG, Munich (DE)

(72) Inventor: Gerhard Kahmen, Oberhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/619,566

(22) Filed: Feb. 11, 2015

(65) Prior Publication Data

US 2015/0229270 A1    Aug. 13, 2015

(30) Foreign Application Priority Data

Feb. 12, 2014  (DE) .......................... 10 2014 202 534
Jun. 5, 2014   (DE) .......................... 10 2014 210 747

(51) Int. Cl.
*H03B 5/36*    (2006.01)
*H03L 7/08*    (2006.01)
*H03L 7/099*   (2006.01)

(52) U.S. Cl.
CPC .............. *H03B 5/368* (2013.01); *H03L 7/08* (2013.01); *H03L 7/099* (2013.01)

(58) Field of Classification Search
CPC .................................... H03B 5/36; H03L 7/08
USPC ................. 331/16, 17, 154; 327/156–158
See application file for complete search history.

(56) References Cited

U.S. PATENT DOCUMENTS

| | | | | |
|---|---|---|---|---|
| 2008/0001680 A1* | 1/2008 | El Rai | ................. | H03B 5/1847 331/167 |
| 2009/0072912 A1* | 3/2009 | Kim | ....................... | H03L 7/107 331/16 |
| 2010/0213039 A1* | 8/2010 | Saito | ...................... | B81B 3/007 200/181 |
| 2010/0214031 A1* | 8/2010 | Yamamoto | .............. | H03L 7/087 331/34 |
| 2011/0109383 A1* | 5/2011 | Lan | ......................... | H01P 1/127 327/574 |
| 2011/0221307 A1* | 9/2011 | Liu | ....................... | B81B 3/0072 310/325 |
| 2014/0268482 A1* | 9/2014 | DeReus | ................. | B81B 3/001 361/290 |

(Continued)

FOREIGN PATENT DOCUMENTS

WO    2011097093 A2    8/2011

OTHER PUBLICATIONS

A. Dec et al., "Microwave MEMS-Based Voltage-Controlled Oscillators" IEEE Transactions on Microwave Theory and Techniques, vol. 48, No. 11, Nov. 2000, pp. 1943-1949.

(Continued)

*Primary Examiner* — Jeffrey Shin
(74) *Attorney, Agent, or Firm* — Ditthavong & Steiner, P.C.

(57) ABSTRACT

The invention, according to various embodiments described herein, relates to a phase-locked loop with a phase detector and a controlled oscillator. The controlled oscillator provides a varactor. The varactor is embodied using MEMS technology. According to the invention, the control bandwidth of the phase-locked loop is larger than the mechanical resonant frequency of the varactor.

16 Claims, 7 Drawing Sheets

(56) References Cited

U.S. PATENT DOCUMENTS

2014/0307361 A1* 10/2014 Kahmen .................. B81B 7/00
361/290

OTHER PUBLICATIONS

M. Yellepeddi et al., "Issues in the Design and Simulation of a MEMS VCO based on Phase-Locked Loop", IIEEE International Symposium on Circuits and Systems, 2007. ISCAS 2007, May 27-30, 2007, pp. 1553-1556.

* cited by examiner

PHASE-LOCKED LOOP WITH A VARACTOR BASED ON MEMS TECHNOLOGY

CROSS-REFERENCE TO RELATED APPLICATION

The present application claims priority to German Patent Application No. 10 2014 202 534.6 filed on Feb. 12, 2014 and German Patent Application No. 10 2014 210 747.4 filed on Jun. 5, 2014, the entire contents of which are herein incorporated by reference.

FIELD OF THE INVENTION

The invention, according to various embodiments described herein, relates to a phase-locked loop with a varactor based on MEMS technology.

DISCUSSION OF THE BACKGROUND

A phase-locked loop (abbreviation PLL) is an electronic circuit arrangement which influences the phase position and the frequency of the controllable oscillator via a closed control loop in such a manner that the phase deviation between an input signal of the phase-locked loop and an output signal picked up at the oscillator output is constant to a high degree. A signal of stable frequency and phase position is thus generated by means of a phase-locked loop.

The phase-locked loop is used in communications technology, control technology and measurement technology, for example, for the realization of frequency synthesizers, in digital communications systems, for clock recovery and for synchronization.

The simplest form of a phase-locked loop comprises a phase detector and a controlled oscillator which are combined in a control loop and influence one another mutually in this manner.

In the settled condition of the phase-locked loop, a tracking of the oscillator frequency and the phase relative to an input signal $Sig_{in}$ is therefore obtained. In the case of changes of the input signal $Sig_{in}$ or a change of the $Sig_{out}$ caused by an adjustment of the controlled oscillator, the phase-locked loop tries, determined by the negative feedback at the phase detector, to keep an error signal as small as possible and close to the value zero.

A controlled oscillator for a phase-locked loop is generally constructed with tunable capacitors. In high-frequency technology, varactors are used as tunable capacitors in order to vary the frequency of the controlled oscillator. For this purpose, a variable DC voltage is applied to the varactor, wherein the varactor behaves like a capacitor with capacitance dependent upon the DC voltage.

In semiconductor processes which are used for monolithic-integrated controlled oscillators, high quality varactors are generally unavailable. For such circuits, especially PN junctions of transistors or respectively channel capacitances of field-effect transistors are used as tuning elements. These monolithic-integrated semiconductor varactors provide a series of disadvantages.

Firstly, these monolithic-integrated semiconductor varactors behave in a very non-linear manner, in particular, so that a broad analogue tuning of the varactors over a tuning range is not practicable. Furthermore, especially semiconductor varactors realized on the basis of field-effect transistors provide a comparatively high 1/f noise, so that these monolithic-integrated semiconductor varactors add a significant noise component to the VCO output signal, and the quality of the output signal can be significantly impaired.

Furthermore, these monolithic-integrated semiconductor varactors generally provide only a small tuning range, so that the capacitance changes caused by the DC-voltage variations are too small for given applications. Accordingly, controlled oscillators with monolithic-integrated semiconductor varactors generally provide a very narrow bandwidth, so that the tuning range of the controlled oscillator amounts to only a few percent of the oscillation frequency. Broadband oscillators with very good phase noise, as required for measurement technology, cannot be realized with these monolithic-integrated semiconductor varactors.

Furthermore, varactors with a discrete construction are known, that is, as discrete components. Semiconductor diodes based on silicon, gallium arsenide or indium phosphide have so far been used for this purpose. Such varactors are also referred to as varicaps or respectively capacitance diodes. In view of their size and their rising manufacturing costs, these varactors are not suitable in increasingly miniaturized environments. Furthermore, there is the risk, that discrete varactors may be withdrawn by the manufacturer which leads to a redesign of the circuit. Accordingly, a cost-favorable and consistent manufacture of an electronic circuit by means of discrete varactors is not possible.

Furthermore, varactors using micro-systems technology (Micro-Electro-Mechanical-Systems, abbreviation MEMS-varactors) are known. In particular, these MEMS-varactors provide no 1/f noise. MEMS-varactors achieve a very good quality because of their low ohmic losses, for example, as a result of the absence of the bulk resistance present in the case of semiconductor varactors. The disadvantage with MEMS-varactors is their high sensitivity to vibrations and the Brownian noise of airborne and atmospheric molecules, so that, especially the microphony properties of such MEMS-varactors argue against using them as controllable oscillators.

High precision varactors based on MEMS technology, such MEMS-varactors, can be used, in particular, in voltage-controlled oscillators. These voltage-controlled oscillators can therefore also be used in phase-locked loops.

In order to obtain a high-precision MEMS-varactor, a varactor is embodied with a comb structure, which is biased differently via a plurality of DC voltages in order to generate a correspondingly precise capacitance. The manufacture of a varactor of this kind is very cost intensive, and the varactor can be realised only in very narrow-band applications.

SUMMARY OF THE INVENTION

According to one embodiment, a phase-locked loop which overcomes the disadvantages mentioned in the introduction is provided. In particular, the noise behaviour and the microphony behaviour of the MEMS-varactor-based phase-locked loop may be improved so that these operate with high precision, especially for use in high-frequency measurement technology. Furthermore, the phase-locked loop may be capable of tuning over a very broad bandwidth and may be capable of full integration.

The phase-locked loop according to one embodiment comprises a phase detector and a controlled oscillator, wherein the controlled oscillator provides a varactor, and the varactor is embodied using MEMS technology. The control bandwidth of the phase-locked loop may be larger than the mechanical resonant frequency of the varactor.

The control bandwidth may also be designated as the modulation range of the phase-locked loop and is the bandwidth in which the phase-locked loop can still control out deviations of the frequency of the input signal from the desired carrier frequency. In other words: the control bandwidth may be the bandwidth in which the phase-locked loop provides a control behaviour, wherein the freewheeling operation of the controlled oscillator, in which neither a settling on an input frequency nor a modulation of a previously achieved, settled input frequency of the PLL is possible, is present outside this control bandwidth.

In another embodiment, the varactor is embodied as a micromechanical element, using MEMS technology. Varactors constructed on the basis of micro-systems technology, also referred to in English as Micro-Electro-Mechanical-System, abbreviated as MEMS, may be miniaturized electro-mechanical systems, wherein their components provide dimensions in the micrometer range, and the individual components cooperate as a system. With the use of a MEMS-varactor, a monolithic-integrated controlled oscillator can be obtained, which provides good noise properties and exploits the advantages of full integration. Introduced into a phase-locked loop with control bandwidth matched to the MEMS-varactor, a high precision signal source can be obtained, which may be insensitive to microphony and Brownian noise, that is to say, which may provide good microphony properties. Furthermore, the MEMS-based varactor provides no 1/f noise by comparison with the semiconductor varactor and achieves a high-quality, so that very good signal properties are obtained. The MEMS-varactor may be capable of monolithic integration, thereby allowing lower manufacturing costs.

In the following, varactors based on micro-systems technology may be designated as MEMS-varactors. MEMS-varactors preferably provide a metallic membrane, which is mounted in a movable manner above an actuator face. If a DC voltage is applied between the actuator face and the metallic membrane, electrostatic forces of the actuator may cause a displacement of the metallic membrane.

In the case of a variation of the potential of the direct voltage, the distance between the actuator face and the metallic membrane may be varied. The actuator face and the metallic membrane may represent a plate capacitor in which a capacitance value can be picked up. Because of the variable distance between membrane and actuator electrode, the capacitance value may be variable.

Because of the embodiment of the varactor using MEMS technology, a mechanically oscillating system may be obtained, which represents a second-order system and provides a mechanical resonant frequency, because of the spring constant of the membrane, on the one hand, and the acceleration forces and damping forces acting on the membrane, on the other hand.

If the MEMS-varactor is operated as a tunable element in an oscillator, the latter may operate like a mechanical resonator. Because of the mechanical low-pass character of the resulting resonator, the contribution of the MEMS-varactor in a VCO to the phase noise of the freewheeling oscillator may fall below the mechanical resonant frequency by 20 decibels per decade. Above the mechanical resonant frequency of the MEMS-varactor, the phase noise may fall by at least 20 decibels per decade, preferably by 60 decibels per decade.

Now, if the MEMS-varactor-based VCO is operated in the phase-locked loop, the characteristic of the resulting phase noise may change because of the influence of the MEMS-varactor on the total noise behaviour. As a result of the embodiment of the control bandwidth larger than the mechanical resonant frequency of the MEMS-varactor, the contribution of the phase noise of the MEMS-varactor in the VCO of the phase-locked loop may be pushed below the mechanical resonant frequency because of the control property of the phase-locked loop with the amplification through the phase-locked loop, so that a very low noise output is achieved within the control bandwidth, which may be disposed considerably below that of the freewheeling oscillator. Above the mechanical resonant frequency, the resulting phase noise may decline because of the influence of the MEMS-varactor at 20 decibels per decade, preferably at 60 decibels per decade, so that the noise behavior of the MEMS-varactor may enter into the total noise behavior in an increasingly insensitive manner. Through matching of the control bandwidth to the mechanical resonant frequency of the MEMS-varactor, the negative influences may be suppressed below the mechanical resonance. Above the resonant frequency, these negative influences may no longer be visible. With regard to vibrations, the MEMS-varactor behaves like a mechanical filter with a mechanical-filter bandwidth. The bandwidth of the phase-locked loop and this mechanical filter bandwidth may be matched with one another. Accordingly, the disadvantages of the MEMS-varactor, especially the influence of noise from molecular movement, also referred to as Brownian noise, and the influence of vibrations, may be removed, and a good noise behavior of the phase-locked loop is achieved.

The MEMS-varactor is preferably controlled with an analogue DC voltage.

In a preferred embodiment, the varactors are integrated in a metallic layer of an integrated controlled oscillator core. In this context, the possibility of full integration offers a cost-favourable manufacturing variant for broadband tunable controlled oscillators.

In yet another embodiment, the phase-locked loop preferably provides a frequency splitter within the feedback loop. In this manner, the output frequency of the phase-locked loop can be varied. Accordingly, a stable and adjustable frequency may be generated by means of the phase-locked loop.

The phase-locked loop preferably may provide an integrator, also designated as a loop filter, in the signal path between the phase detector and the controlled oscillator. The loop filter may serve to provide a control voltage, which may be disposed within the control bandwidth, to the controlled oscillator. A constant oscillator input voltage may achieve a constant output voltage at the output of the oscillator.

In a preferred embodiment, the controlled oscillator may be a voltage-controlled oscillator (abbreviation VCO). Alternatively, the oscillator may be operated in a current-controlled manner, wherein the current control within the oscillator is converted into a control for the varactor.

In one embodiment, the control bandwidth provides a factor of at least greater than 2, preferably at least factor 5, by greater preference at least factor 10, by particular preference at least factor 50 by comparison with the mechanical bandwidth of the MEMS-varactor. As a result of the enlarged embodiment of the control bandwidth relative to the mechanical resonant frequency of the varactor, the phase noise of the phase-locked loop provides a constant characteristic within the range of the control bandwidth. This may indicate that, within the control bandwidth, vibrations and noise from molecular movements of the MEMS-varactor are controlled out with the phase-locked loop. Above the control bandwidth, the contribution of the phase noise of the MEMS-varactor of the VCO declines at 60 decibels per decade.

In a preferred embodiment, an overshoot of the phase noise may be prevented, so that the phase noise is monotonic falling for frequencies greater than the mechanical resonant frequency of the varactor. This is achieved in that the control bandwidth of the phase-locked loop may be selected to be so high that the phase noise of the MEMS-varactor is also controlled out by the phase-locked loop in the range of the mechanical resonant frequency. This controlling out achieves a constant phase noise without phase-noise increase in the range of the mechanical resonant frequency.

By preference, at frequencies greater than the mechanical resonant frequency of the MEMS-varactor, the intrinsic noise component of the phase-locked loop may be smaller than the intrinsic noise component of the MEMS-based oscillator. In this context, the control bandwidth can be selected to be ideal. On the one hand, the control bandwidth may be selected not to be too small in order not to influence the decade decline of at least 20 decibels per decade, preferably 60 decibels per decade of the MEMS-varactor with the intrinsic noise of the phase-locked loop, and in particular, not to cause a rise in the transmission behavior in the frequency response below the mechanical resonant frequency. On the other hand, the control bandwidth can be selected not to be too large, in order not to influence the decade decline of at least 20 decibels per decade, preferably 60 decibels per decade of the MEMS-varactor with the control property of the phase-locked loop, and in particular, not to cause a rise of the transmission behavior in the frequency response above the mechanical resonant frequency.

In an advantageous embodiment, the intrinsic noise component of the phase-locked loop may be smaller than that of the freewheeling MEMS-based oscillator at least by the factor 2, preferably at least by the factor 5, by greater preference at least by the factor 10, by particular preference at least by the factor 20, by special preference at least by the factor 100. By preference, the phase noise of the phase-locked loop for frequencies above the control bandwidth may depend only upon the free running MEMS oscillator.

Outside the control bandwidth, the sensitivity of the MEMS-based oscillator to vibrations and noise may decline by at least 20 decibels per decade, preferably 60 decibels per decade, so that the varactor reacts in an increasingly insensitive manner. Through an appropriate matching between mechanical resonant frequency and control bandwidth, noise and vibrations can be suppressed, without the occurrence of increases in the frequency response above the control bandwidth.

In a preferred embodiment, the varactor is embodied with an actuator, wherein a first actuator face of the actuator may be embodied on a substrate. A second actuator face of the actuator may be embodied on a movable membrane. The first actuator face can provide an electrically conducting connections to a first terminal of the controlled oscillator. The second actuator face can provide an electrically conducting connection to a second terminal of the controlled oscillator.

This construction of the varactor may be particularly advantageous since it can be realized simply, and the MEMS-varactor can be fully integrated. In particular, the MEMS-varactor may be integrated in a metallic-layer construction of a semiconductor process, for example, a SiGe BiCMOS process. Furthermore, with this semiconductor process, a large tuning range of the MEMS-varactor can be achieved, since such varactors can be operated at high voltages.

In a preferred embodiment, the movable membrane is a first movable membrane. The varactor additionally may provide a second movable membrane. The second actuator face may be embodied on the first movable membrane and the second movable membrane. The first movable membrane may be arranged above an upper side of the substrate. The second movable membrane may be arranged below a lower side of the substrate facing away from the first upper side.

Varactors based on MEMS provide a high sensitivity to mechanical vibrations, oscillations and accelerations. Through the mechanical method of operation, accelerations on the varactor may influence the adjusted capacitance value.

If an acceleration force acts on the phase-locked loop according to one embodiment, the first membrane and also the second membrane may move in the same direction. Accordingly, the distance between the first membrane and the first actuator face may become larger. However, the distance between the second membrane and the first actuator face may become correspondingly smaller. Accordingly, the capacitance value between the first movable membrane and the first actuator face may in fact increase. However, the capacitance value between the second movable membrane and the first actuator face may become correspondingly smaller.

If the capacitance value between the first movable membrane and the second movable membrane is picked up, the picked-up capacitance value of the varactor may be constant because of the identical directions of movement of the movable membrane.

Alternatively, a first capacitance value between the first movable membrane and the first actuator face may be picked up. Furthermore, a second capacitance value between the second movable membrane and the first actuator face may be picked up. If the first capacitance value and the second capacitance value are connected in parallel, the resulting total capacitance value may be similarly constant.

Accordingly, the influence of the acceleration force caused by an acceleration of the phase-locked loop or a mechanical vibration of the phase-locked loop may be almost without influence on the capacitance value. This suppression of noise and vibrations may additionally contribute to the amplification of the phase-locked loop.

In a preferred embodiment, the first actuator face may provide an electrically conducting connection to a first terminal of a DC-voltage source. The second actuator face may provide an electrically conducting connection to a second terminal of the DC-voltage source. A DC voltage adjusted in the DC-voltage source may be arranged on the first movable membrane and on the second movable membrane for the embodiment of an electrostatic force.

In a preferred embodiment, titanium nitride layers are applied directly on and/or below the movable membrane to the membrane in order to compensate the physical stress.

In a preferred embodiment, the metallic-layer construction is built up from five metallic layers. Through this five-layer construction, actuator face and membranes can to a large extent be configured in an advantageous manner, thereby obtaining a very broad tuning range.

BRIEF DESCRIPTION OF THE DRAWINGS

In the following, the invention, further embodiments and advantages of the invention are explained in greater detail with reference to the drawings, wherein the drawings describe exemplary embodiments of the invention only by way of example. Identical components in the drawings are provided with identical reference numbers. In the drawings, it shows.

DETAILED DESCRIPTION OF THE DRAWINGS

Figure 1:
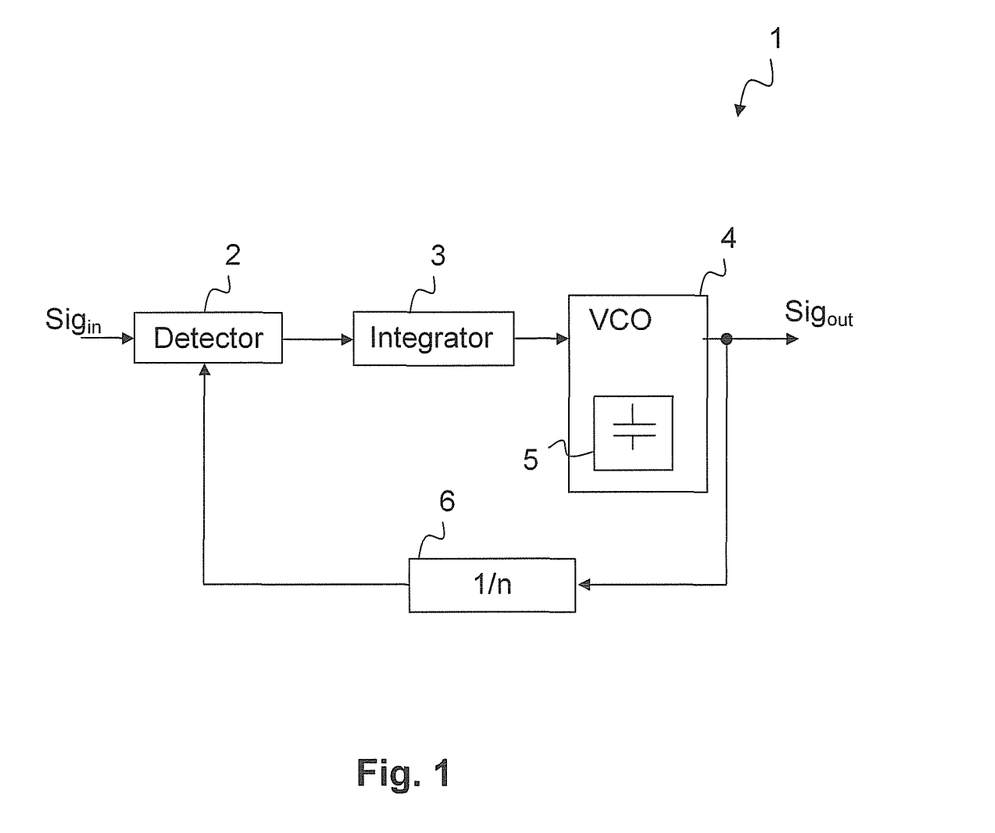
FIG. 1 a block-circuit diagram of a phase-locked loop according to one embodiment.

FIG. 1 shows a block circuit diagram of a phase-locked loop 1 according to one embodiment. The phase-locked loop 1 provides a phase detector 2, an integrator 3 and a controlled oscillator 4. The controlled oscillator 4 comprises a MEMS-varactor 5. An output signal Sigout of the phase-locked loop 1 can be picked up at the output of the controlled oscillator 4. The output of the controlled oscillator 4 is fed back to the phase detector 2. A frequency splitter 6 is provided in the feedback loop in order to adjust the frequency of the output signal Sigout and to use the phase-locked loop 1 more flexibly. An input signal Sigin is connected to the input of the detector 2. Alternatively, the Sigin can be deliberately varied in order to vary the Sigout.

The controlled oscillator 4 is preferably a voltage-controlled oscillator, abbreviated as VCO, in which a DC input voltage is applied in order to vary the frequency of the signal. The variation of the frequency is achieved by means of a MEMS-varactor 5 according to one embodiment.

The phase-locked loop 1 is preferably provided for high-frequency applications, for example, as a synthesizer for gigahertz ranges etc.

In the following, the method of functioning of the phase-locked loop 1 is explained in greater detail. The input signal Sigin is connected to the phase detector 2, also designated as a phase comparator, at a first input. The output signal of the controlled oscillator 4 is supplied to the second input. The phase detector 2 compares the phase position of the input signal Sigin with the phase position of the output signal of the controlled oscillator. At its output, the phase detector 2 supplies a control signal which is supplied to a loop filter 3, here, in the form of an integrator.

The input signal Sigin is also designated as a reference signal with a reference frequency fief. In general, the input signal Sigin is generated by an external signal generator, for example, a quartz oscillator, and is characterized by a high stability and precision.

The oscillator 4 generates the output signal Sigout. The frequency of this signal Sigout is divided by a factor N in the frequency splitter 6. The output signal of the frequency splitter 6 is then supplied to the phase-frequency detector 2. The latter compares the output signal of the frequency splitter 6 with regard to its phase □ and frequency f with the input signal Sigin and generates at its output an error signal which is proportional to their difference. For example, if the phase □ of the frequency-divided oscillator output signal Sigout races ahead of the phase □ of the input signal Sigin after division in the splitter 6, the phase detector 2 generates at its output a negative signal which slows down the oscillator 4 and accordingly somewhat reduces the output frequency. This is continued until both phases agree.

The loop filter 3 is disposed at the output of the phase-frequency detector 2. The loop filter 3 serves to convert the high-frequency output signal of the phase detector into a control signal within the control bandwidth. As a result, a constant oscillator control voltage is obtained. By selecting the filter order, the behavior of the phase-locked loop 1 is strongly influenced with regard to stability, settling time and interference-frequency suppression.

In the settled condition of this arrangement, a tracking of the oscillator frequency and phase relative to the input signal Sigin is obtained. In this context, determined by the negative feedback in the phase detector 2, the phase-locked loop 1 tries to keep the error signal as small as possible and close to the value zero by adjusting the controlled oscillator 4 in the case of changes of the input signal Sigin.

Figure 2:
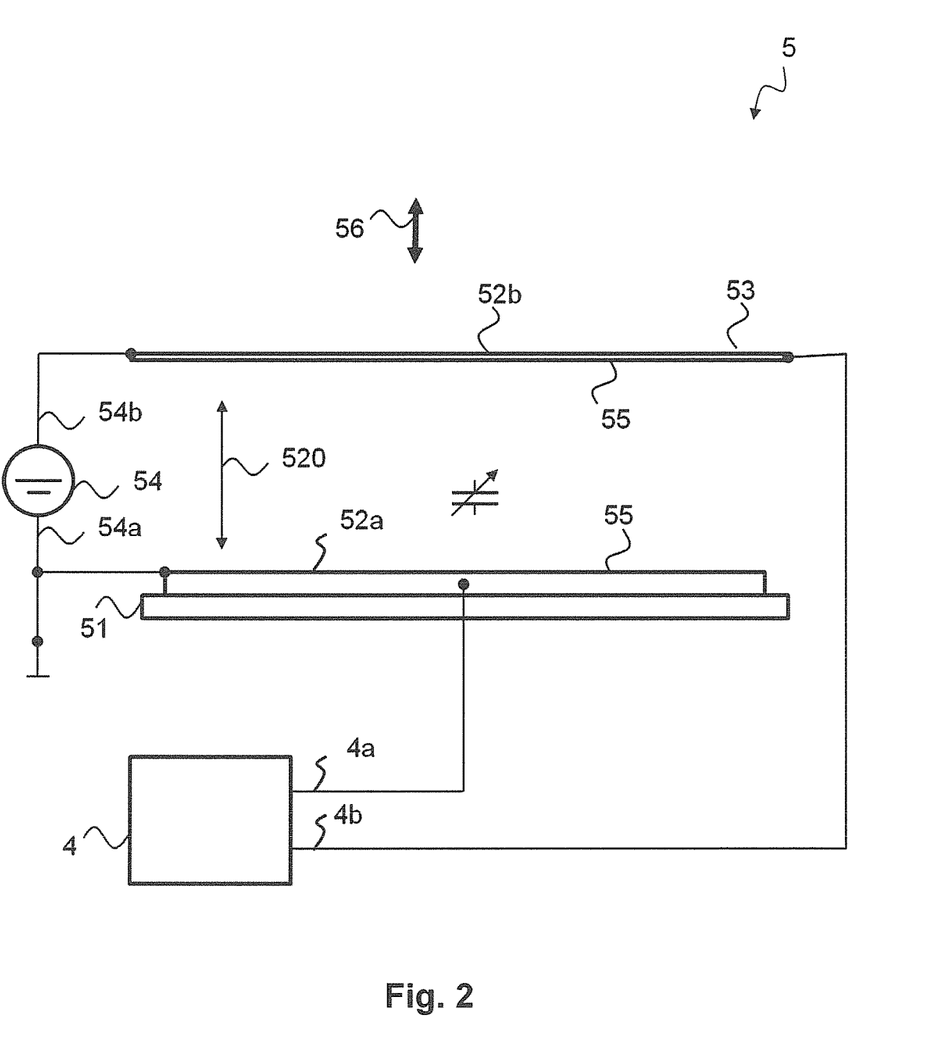
FIG. 2 a varactor according to one embodiment for a phase-locked loop according to FIG. 1.

FIG. 2 shows a MEMS-varactor 5 for a phase-locked loop 1 according to one embodiment. The MEMS-varactor 5 provides a substrate 51, on which a first actuator face 52a is embodied. A movable membrane 53 is arranged above the substrate 51. The membrane 53 is embodied in an electrically conducting manner.

The method of functioning of the MEMS-varactor according to FIG. 2 will now be described. The actuator face 52a on the substrate 51 is connected in an electrically conducting manner to a first terminal 54a of a DC voltage source 54. The membrane 53 is connected in an electrically conducting manner to a second terminal 54b of the DC-voltage source 54. Accordingly, the movable membrane 53 is a second actuator face 52b. By connecting a DC voltage by means of the DC-voltage source 54, an electrostatic force 520 is embodied between the first actuator face 52a and the second actuator face 52b. Because of the spring constant of the material of the movable membrane 53, the movable membrane 53 is positioned by the DC voltage at a certain distance above the substrate 51. An equilibrium is established between electrostatic force and counteracting spring constant.

Since both the actuator face 52a and the membrane 53 are embodied in an electrically conducting manner, the movable membrane 53 and the first actuator face 52a each represent a capacitor face 55. Accordingly, a MEMS-varactor 5 is obtained through the adjustable DC-voltage source 54. The first actuator face 52a of the substrate 51 is connected in an electrically conducting manner at a first terminal 4a to the remaining circuit of the controlled oscillator 4. The second actuator face 52b of the membrane 53 is connected in an electrically conducting manner at a second terminal 4b to the remaining circuit of the controlled oscillator 4.

Figure 3A:
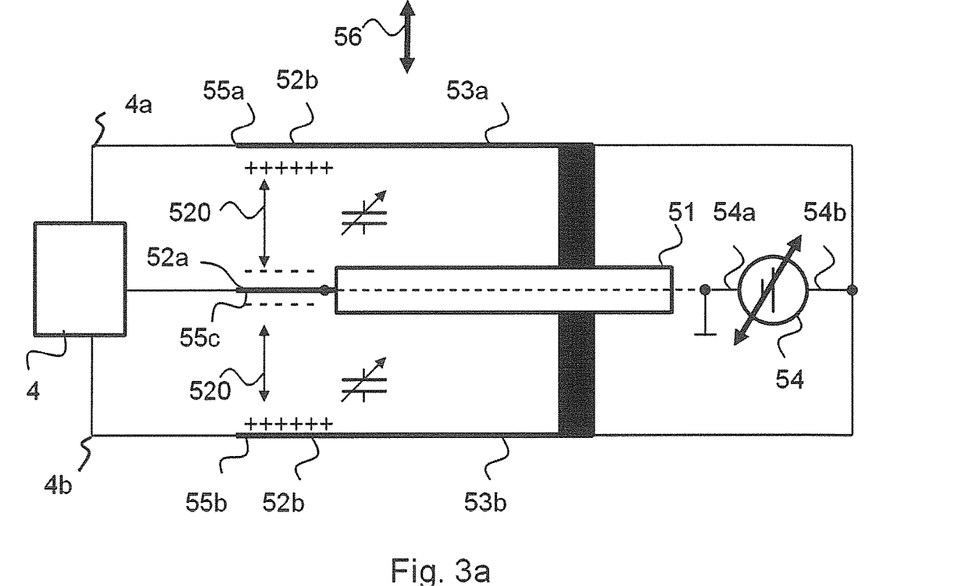
FIG. 3a an alternative embodiment to FIG. 2 of a varactor according to one embodiment for a phase-locked loop according to FIG. 1.
Figure 3B:
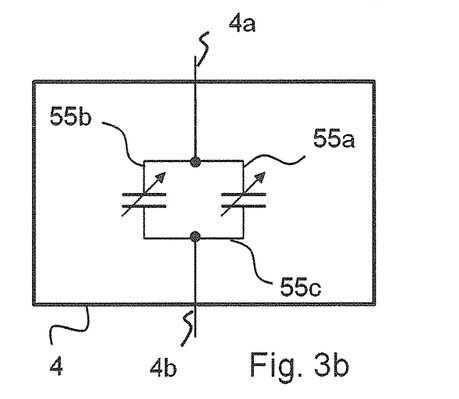
FIG. 3b an equivalent circuit diagram of the MEMS-varactor according to one embodiment according to FIG. 3a in a first configuration.
Figure 3C:
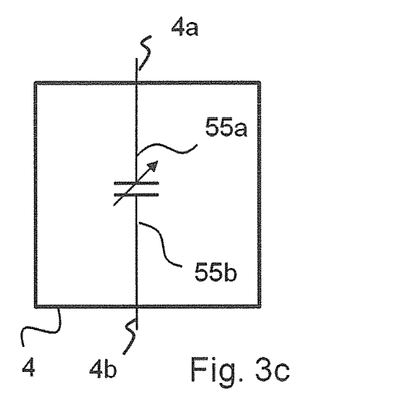
FIG. 3c an equivalent circuit diagram of the MEMS-varactor according to one embodiment as shown in FIG. 3a in a second configuration as an alternative to the first configuration.

FIGS. 3a to 3c show a first embodiment of a MEMS-varactor 5 according to one embodiment, wherein FIG. 3b and FIG. 3c show different resulting equivalent circuit diagrams of the MEMS-varactor 5 illustrated in FIG. 3a. In FIG. 3a, a substrate 51 provides a first upper side and a lower side facing away from the upper side. A first actuator face 52a is embodied on the substrate 51. The first actuator face 52a in this context can be embodied both on the upper side and also on the lower side of the substrate 51. Alternatively, the first actuator face 52a can be a metallized region of the substrate 51, as shown in FIG. 3a.

A first movable membrane 53a is arranged above the upper side of the substrate 51. Below the lower side of the substrate 51, a second movable membrane 53b is arranged. In FIG. 3a, the first movable membrane 53a and the second movable membrane 53b are embodied to be electrically conducting. The first movable membrane 53a is a first capacitor face 55a and a second actuator face 52b. The second movable membrane 53b is a second capacitor face 55b and a second actuator face 52b. The first actuator face 52a is connected in an electrically conducting manner to a first terminal 54a of a DC-voltage source 54. The second actuator face 52b of the first membrane 53a and also the second membrane 52b are connected in an electrically conducting manner to a second terminal 54b of the DC-voltage source 54. The first movable membrane 53a forms a first capacitor face 55a. The second movable membrane 53b forms a second capacitor face 55b. In this context, the first actuator face 52a is a third capacitor face 55c.

The first capacitor face 55a forms a first tunable capacitor with the first actuator face 52a or respectively the third capacitor face 55c. The second capacitor face 55b forms a second tunable capacitor with the first actuator face 52a or respectively the third capacitor face 55c. The first capacitor face 55a, the second capacitor face 55b and the third capacitor face 55c are each connected to the remaining circuit of the controllable oscillator 4. The MEMS-varactor 5 picked up is accordingly either a parallel circuit of the first and the second tunable capacitor or, in the case of a non-use of the third capacitor face 55c in the remaining circuit of the oscillator 4, a MEMS-varactor 5 formed by the first movable membrane 53a and the second movable membrane 53b.

In the following, the method of functioning of the MEMS-varactor 5 according to FIG. 3a will be described. Through the connection of a DC voltage by means of the DC-voltage source 54, a first actuator is obtained above the substrate 51, of which the electrostatic force 520 acts above the substrate 51. Furthermore, a second actuator is obtained, of which the electrostatic force 520 acts below the substrate 51. In this exemplary embodiment, the electrostatic force 520 on the upper side and on the lower side of the substrate 51 is regarded as identical. The electrostatic force 520 can be varied via the voltage level of the direct voltage 54.

The varactor 5 to be attached to the remaining part of the controlled oscillator 4 is adjustable exclusively via the first movable membrane 53a and the second movable membrane 53b. This means that the substrate 51 of the varactor 5 is fixed. A force 56 acting from the outside on the varactor 5 has the consequence that both the upper actuator and also the lower actuator are influenced.

If the spring constants of the membranes 53a and 53b are identical in size, the two membranes 53a and 53b move in the same direction subject to the action of the acceleration force 56. This effect is now exploited in an alternative manner, as will be explained with reference to FIG. 3b and FIG. 3c.

According to FIG. 3b, the first capacitor face 55a, the second capacitor face 55b and also the third capacitor face 55c are used for the remaining part of the controlled oscillator 4. In this context, the third capacitor face 55c forms a first varactor terminal 4b. The first capacitor face 55a and the second capacitor face 55b form a second varactor terminal 4a of the MEMS-varactor 5 according to one embodiment. Accordingly, a parallel circuit is formed from the two individual capacitors. The resulting total capacitance of the varactor 5 for the oscillator 4 therefore does not vary, since the capacitance value of parallel-connected capacitors is always the sum of the individual capacitors. An enlargement of the first capacitance value (upper actuator) and simultaneous reduction of the second capacitance value (lower actuator) leads to an acceleration-resistant sum of both partial capacitances of the varactor 5. Accordingly, the force 56 acting from outside is without influence on the varactor capacitance. However, the adjustability of the varactor capacitance value through the DC voltage 54 continues to apply.

According to FIG. 3c, the remaining part of the oscillator 4 is connected in an alternative manner. In this context, the third capacitor face 55c is not used in the oscillator 4. Instead, the first capacitor face 55a forms the first varactor terminal 4a and the second capacitor face 55b forms the second varactor terminal 4b. The adjustable capacitor is therefore formed by the first capacitor face 55a and the second capacitor face 55b. In this context, in one variant, the common third capacitor face 55c of the two individual capacitors is evident, thereby obtaining a series circuit of both individual capacitors. Alternatively, the substrate 51 can also act as an additional dielectric. Since both the first capacitor face 55a and also the second capacitor face 55b move in the same direction in the case of an action of the force 56 on the varactor 5, the resulting capacitor does not change, thereby also obtaining an acceleration-resistant varactor.

The varactors 5 shown in the FIG. 2 and FIG. 3 are designed for high-frequency applications in the gigahertz range. The construction of the varactors 5 according to FIG. 2 or FIGS. 3a-3c is preferably implemented in a fully integrated manner in a metallic-layer construction of a semiconductor process, for example, a SiGe BiCMOS process. Accordingly, the varactor 5 can be charged with high frequencies, because the varactor 5 is now unresponsive to the high-frequency and is not modulated by the high-frequency voltage. Furthermore, with this semiconductor process, a broad tuning range of the MEMS-varactor can be achieved, because such varactors can be operated with high tuning voltages up to 40 V and even beyond, independently of the breakdown voltage of the semiconductor components.

In the case of the use of a VCO tunable across a broad bandwidth, the movable membranes 53, 53a, 53b should be prevented from coming into contact with the actuator face 52a of the substrate 51, a so-called pull-in effect. The membranes 53, 53a, 53b are preferably realized in layer 1 of the five-layer construction, wherein this layer is, for example, three micrometers thick and is made from aluminum-copper (AlCu). Different layer constructions are also included within the idea of the embodiment. This layer allows a low series resistance and a membrane 53 with a high spring constant. The actuator face 52a is realized in metallic layer 4 of the five-layer construction, whereas the capacitor face 55c is realized in metallic layer 2, wherein metallic layer 2 is disposed at a distance from metallic layer 4. This spacing distance allows an influence on the tuning range respectively the precision of tuning.

Figure 4:
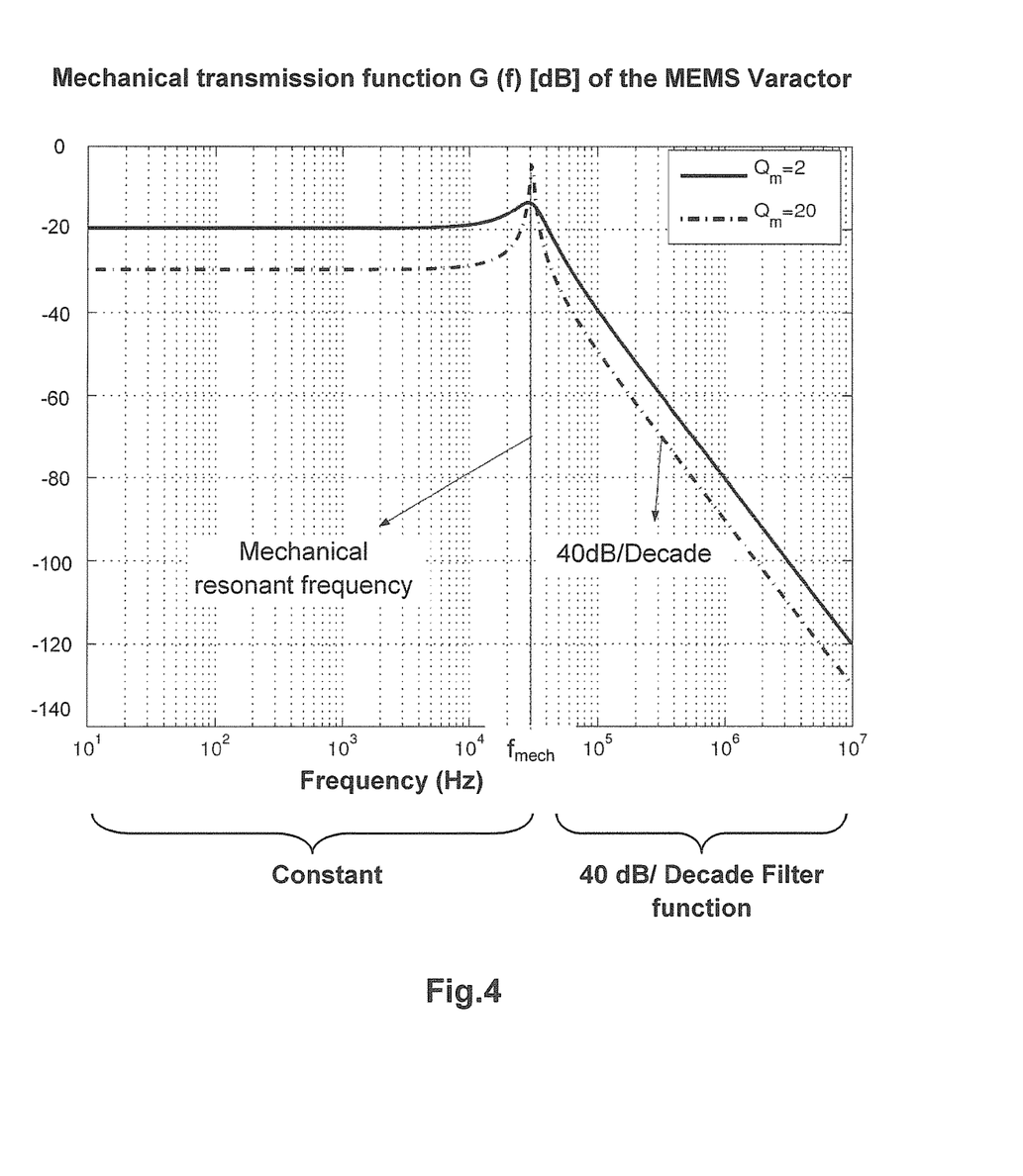
FIG. 4 a contribution to the noise power density of an MEMS-varactor according to one embodiment.

FIG. 4 shows a mechanical transmission function G(f) in decibels of a MEMS-varactor 5 according to one embodiment for use in a phase-locked loop 1 according to FIG. 1. In this context, two different transmission behaviors are shown, wherein the different curves differ through different mechanical quality grades Q1=2 and Q1=20 of the varactor 5. The quality is significantly determined by the mechanical geometry and the surrounding atmosphere.

The mechanical transmission function G(f) can be subdivided into two ranges, wherein a mechanical resonant frequency fmech of the varactor 5 subdivides the two ranges. Below the mechanical resonant frequency fmech, the transmission function G(f) of the varactor 5 is constant, that is, a constant sensitivity, for example, to Brownian motion of the molecules and vibrations is present.

Above the mechanical resonant frequency fmech, the sensitivity of the MEMS-varactor 5 falls to 40 decibels per decade, because a second order system is present. This part of the transmission function G(f) can be regarded as a second-order mechanical filter based on the mechanical filter property of the MEMS-varactor 5 above the mechanical resonant frequency fmech.

Figure 5:
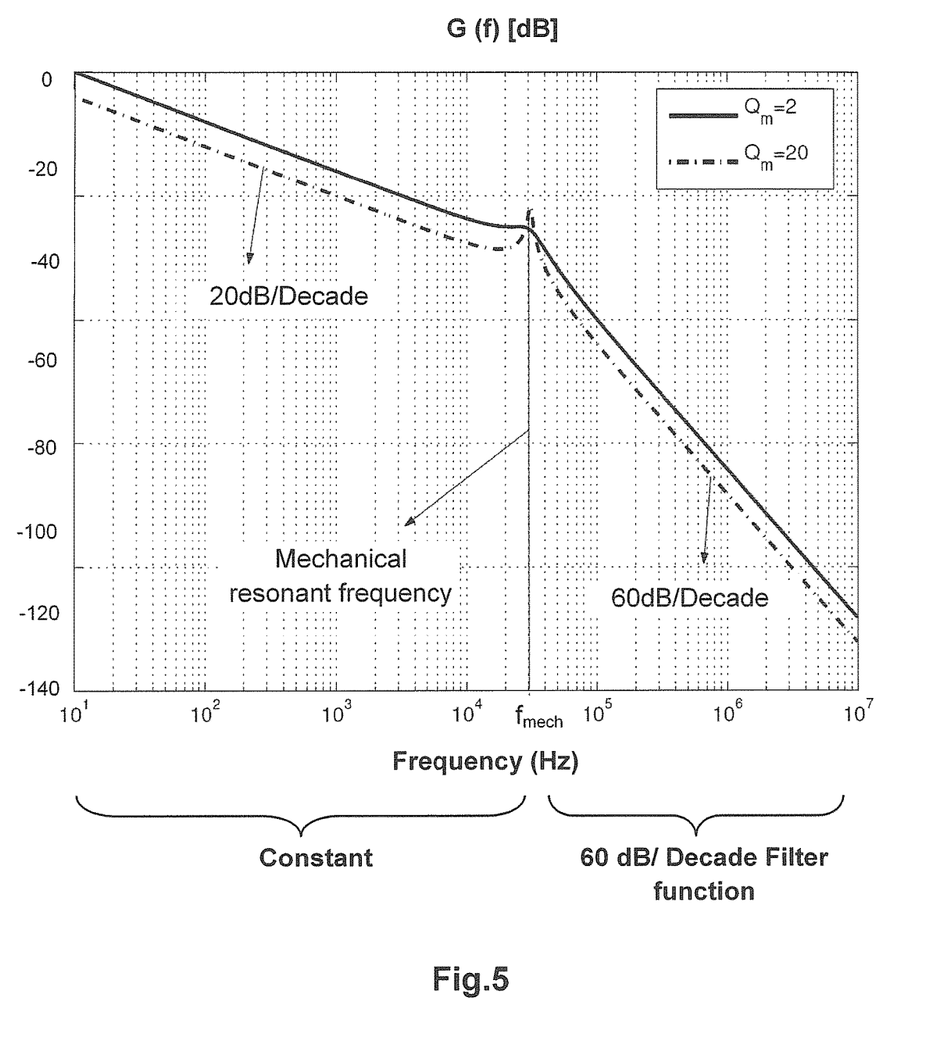
FIG. 5 a contribution to the noise power density of the controlled oscillator with MEMS-varactor according to one embodiment.

FIG. 5 shows a mechanical transmission function G(f) in decibels of a voltage-controlled oscillator 4 (VCO) according to one embodiment with MEMS-varactor 5 for a phase-locked loop 1 as shown in FIG. 1. In this context, the contribution of the MEMS-varactor 5 to the phase noise of the VCO 4 is shown dependent upon the frequency.

Accordingly, the VCO 4 illustrated in FIG. 5 is not introduced into a phase-locked loop 1, but was measured freewheeling. The noise behavior of this VCO circuit is divided in two, wherein a mechanical resonant frequency fmech divides these two ranges. In principle, the VCO has a first-order filter property, so that, in the case of a constant Brownian noise and constant vibrations, the phase noise theoretically falls steadily by 20 decibels per decade. However, it must also be taken into account that the phase noise of this VCO 4 is not only generated by the electrical noise, but the mechanical noise of the MEMS-varactor 5 also exerts an influence on this noise behavior.

Below the mechanical resonant frequency fmech, the noise of the MEMS-varactor enters directly into the VCO noise (see also FIG. 4), so that the phase noise in this region is also significantly influenced by the noise of the MEMS-varactor. Only the filter property of the oscillator 4 leads to a decline of 20 decibels per decade.

Above the mechanical resonant frequency, the sensitivity of the MEMS-based varactor 5 declines by 40 decibels per decade. Accordingly, the phase noise of the VCO 4 above the resonant frequency fmech declines at 60 decibels per decade.

Figure 6:
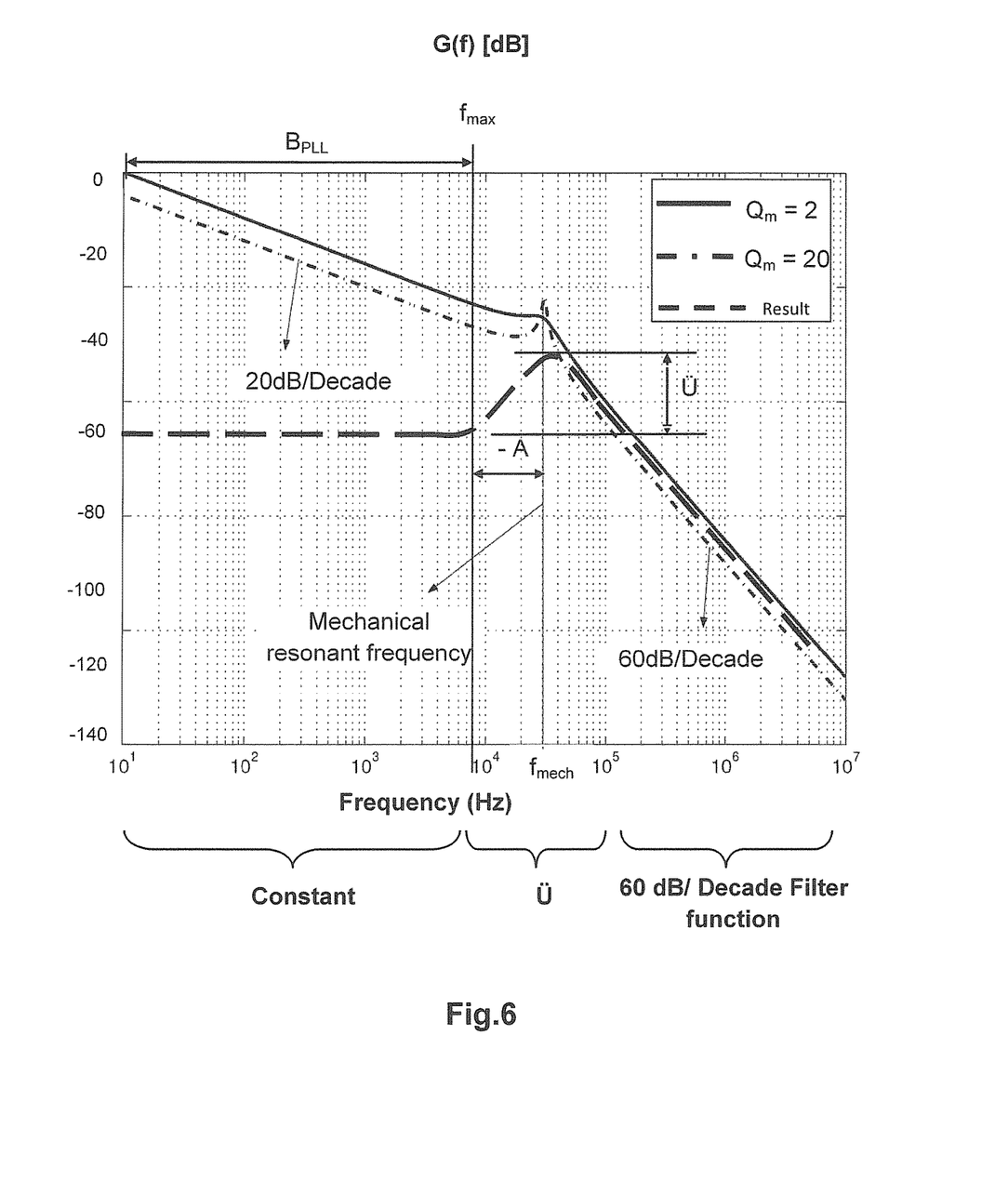
FIG. 6 a contribution to the noise power density of a phase-locked loop according to one embodiment as shown in FIG. 1 with an excessively small control bandwidth.

FIG. 6 shows the contribution of the phase noise of the MEMS-varactor 5 shown in FIG. 5 as a transmission function G(f) in decibels with the resulting phase noise in connection with the phase-locked loop 1. The resulting phase noise in this context is illustrated with a dashed line. It is evident that the range is now divided into three. The first range is constant, since the phase-locked loop 1 can control out the phase noise of the MEMS-based VCO 4 and a stable frequency position and phase position is obtained as the output signal Sigout. In this range, the phase noise is determined only by the intrinsic noise of the phase-locked loop 1.

In the third range, the phase noise follows the freewheeling noise of the VCO 4 with a monotonic decline by 60 decibels per decade, since the noise is significantly influenced and determined by the intrinsic noise of the phase-locked loop.

However, the middle range Ü according to FIG. 6 is undesirable. This is because the phase-locked loop 1 provides a control bandwidth BPLL which is not matched in an ideal manner to the mechanical resonant frequency fmech of the MEMS-varactor 5. The control bandwidth BPLL extends from zero up to the maximum control frequency fmax. Fmax is generally determined by the limit frequency of the integrator 3. If the control bandwidth BPLL is smaller than the mechanical resonant frequency fmech, the resulting phase noise is characterized by a phase-noise overshoot Ü. This phase-noise overshoot Ü occurs because the phase-locked loop 1 cannot completely control out the noise of the VCO 4 above the control bandwidth BPLL. The overshoot Ü over the phase noise of the VCO is caused as a result. This overshoot Ü must be removed through appropriate parameterization of the control bandwidth BPLL.

Because of the use of MEMS-based varactors 5 instead of semiconductor-based varactors, the contribution of the phase noise is also constant close to the carrier and is not disadvantageously influenced by 1/f-noise, because 1/f noise does not exist in the case of MEMS-varactors 5.

Alternatively and not illustrated in FIG. 6, a control bandwidth BPLL much larger than the mechanical resonant frequency fmech would lead to an overshoot in the fourth range, since the control property of the phase-locked loop 1 would be superposed on the noise component, and the desired mechanical filter property of 60 decibels per decade would not be achieved.

Accordingly, it is critical to match the control bandwidth BPLL to the mechanical resonant frequency fmech, on the one hand, in order not to obtain an overshoot Ü and, on the other hand, in order to obtain the desired mechanical-filter effect of the MEMS-varactor 5 in the VCO 4 above the mechanical resonant frequency fmech.

Figure 7:
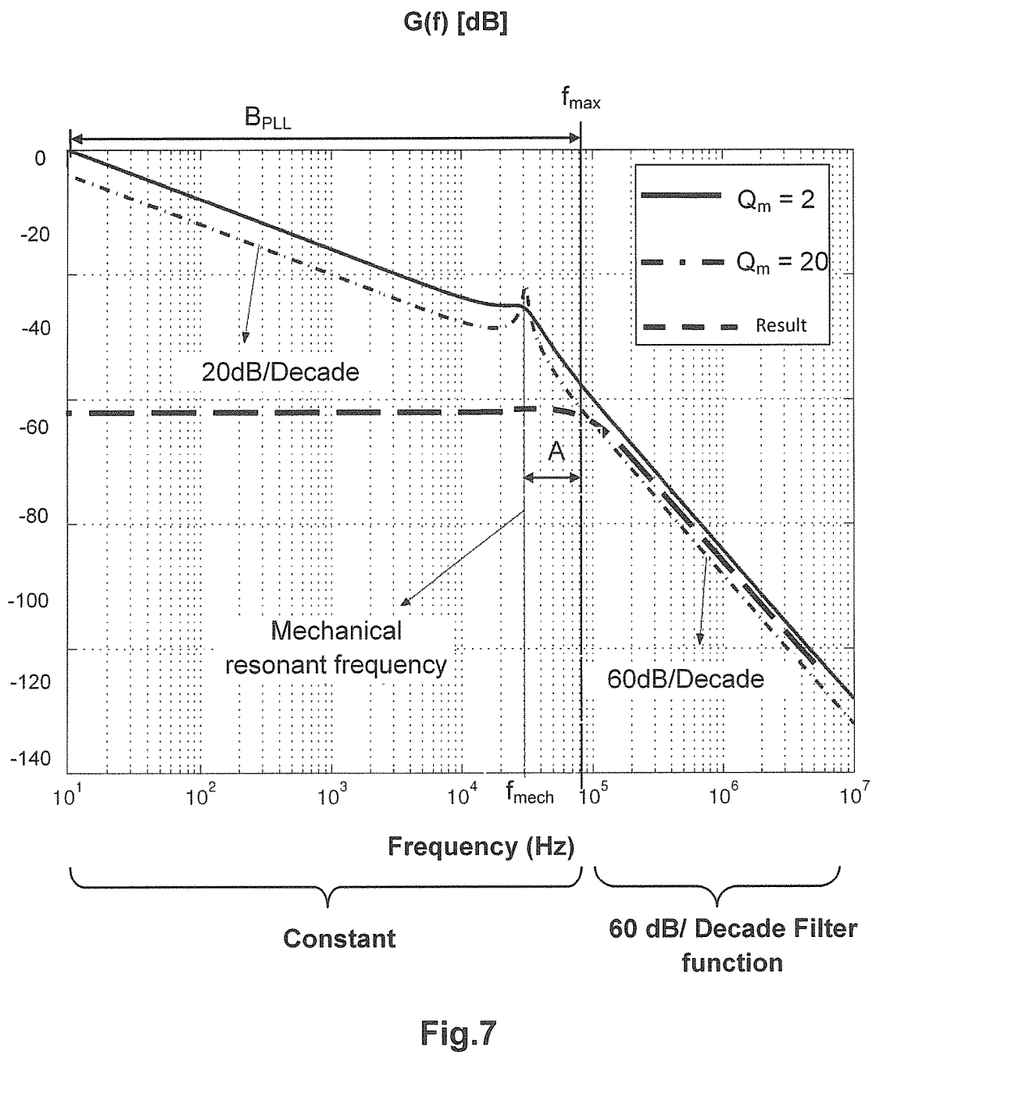
FIG. 7 a contribution to the noise power density of a phase-locked loop according to one embodiment as shown in FIG. 1 with an ideally adjusted control bandwidth.

FIG. 7 also illustrates the contribution of the phase noise of the MEMS-varactor 5 shown in FIG. 5 as a transmission function G(f) in decibels with an alternative resulting phase noise of the phase-locked loop 1 to FIG. 6. FIG. 7 shows a behavior of the phase-locked loop 1 which provides a control bandwidth BPLL which is larger than the mechanical resonant frequency fmech. In other words, the maximum frequency of the control bandwidth BPLL is larger than the mechanical resonant frequency fmech. It is evident that the overshoot Ü of the resulting phase noise does not occur in FIG. 7.

By preference and also illustrated in FIG. 7, the distance A between the control bandwidth BPLL and the mechanical resonant frequency fmech of the MEMS-varactor 5 is so large that the control bandwidth BPLL or respectively the maximum frequency fmax of the control bandwidth BPLL is greater at least by the factor 2, preferably at least by the factor 5, by greater preference at least by the factor 10, by particular preference at least by the factor 50 than the mechanical resonant frequency fmech. Accordingly, the phase-locked loop 1 is also capable of following the input signal Sigin beyond the mechanical resonant frequency fmech of the varactor, so that the resulting phase noise by comparison with a parameterization shown in FIG. 6 is linear over a further frequency decade.

According to one aspect of one embodiment, the adjustment of the control bandwidth with reference to the mechanical resonant frequency is advantageous to the extent that the phase noise of the phase-locked loop is constant over broad stretches and only declines above the mechanical resonant frequency fmech of the MEMS-varactor to 60 decibels per decade. This is attributable to the insensitivity of the MEMS-varactor to vibrations and Brownian noise.

According to one aspect of an embodiment, a MEMS-varactor 5 is proposed for a phase-locked loop 1, so that a combination of the mechanical adjustable MEMS-varactor which limits the noise and provides a mechanical-filter effect relative to vibrations and Brownian noise is obtained with a classical phase-locked loop 1.

Accordingly, up to the control bandwidth BPLL, the phase-locked loop 1 controls the resulting phase noise and PLL noise to a constant value which depends upon the amplification of the phase-locked loop 1. The VCO-noise is suppressed.

Now, if the control bandwidth BPLL is matched to the mechanical resonant frequency fmech of the MEMS-varactor 5 of the controlled oscillator 4, a broadband, high-precision and stable phase-locked loop 1 is obtained, which provides a transmission behavior as shown in FIG. 7, that is to say, no overshoot of the noise and insensitivity to vibrations and Brownian noise. In this manner, the MEMS-varactor can be used without restriction. The disadvantages are overcome because of the phase-locked loop 1 matched with reference to the control bandwidth BPLL.

By preference, in the case of frequencies larger than the mechanical resonant frequency fmech of the MEMS-varactor 5, the intrinsic noise component of the phase-locked loop 1 is smaller than the phase noise, also designated as the intrinsic noise component, of the freewheeling MEMS-based VCO 4. In this context, the control bandwidth BPLL should not be selected too small in order to avoid the noise overshoot. The intrinsic noise component of the phase-locked loop 1 is smaller at least by the factor 2, preferably at least by a factor 5, by greater preference at least by a factor 10, by particular preference at least by a factor 20, by special preference at least by a factor of 100.

In general, MEMS-varactors provide mechanical resonant frequencies up to a maximum of several hundred kilohertz. In this context, the VCO 4 can be operated up to the high gigahertz ranges above the mechanical resonant frequency fmech. The susceptibility of the MEMS-based VCO 4 to microphony is strongly improved by the MEMS-varactor 5 according to one embodiment in a phase-locked loop 1. The DC-voltage source 54 typically provides a range from 0 up to 40 V or above.

Within the scope of one embodiment, all of the elements described and/or illustrated and/or claimed can be combined arbitrarily with one another.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A phase-locked loop comprising:
a phase detector; and
a controlled oscillator, wherein the controlled oscillator provides a MEMS-varactor, wherein the control bandwidth of the phase-locked loop is larger than the mechanical resonant frequency of the MEMS-varactor, wherein the mechanical resonant frequency is built by a spring constant of a membrane of the MEMS-varactor as well as an acceleration force and a damping force acting on the membrane of the MEMS-varactor, wherein the MEMS-varactor provides an actuator, wherein a first actuator face of the actuator is embodied on a substrate, wherein a second actuator face of the actuator is embodied on a movable membrane, wherein the first actuator face provides an electrically conducting connection to a first terminal of the controlled oscillator, wherein the second actuator face provides an electrically conducting connection to a second terminal of the controlled oscillator, wherein the movable membrane is a first movable membrane, wherein the MEMS-varactor additionally provides a second movable membrane, wherein the second actuator face is embodied on the first movable membrane and the second movable membrane, wherein the first movable membrane is arranged above an upper side of the substrate, and wherein the second movable membrane is arranged below a lower side facing away from the upper side of the substrate.

2. The phase-locked loop according to claim 1, wherein the control bandwidth is larger than the mechanical resonant frequency at least by the factor 2.

3. The phase-locked loop according to claim 1, wherein the phase noise of the phase-locked loop is monotonic falling for frequencies greater than the mechanical resonant frequency of the MEMS-varactor.

4. The phase-locked loop according to claim 1, wherein, at frequencies greater than the mechanical resonant frequency of the MEMS-varactor, the intrinsic noise component of the phase-locked loop is smaller than the intrinsic noise component of the freewheeling oscillator.

5. The phase-locked loop according to claim 4, wherein the intrinsic noise component of the phase-locked loop is smaller than the intrinsic noise component of the freewheeling oscillator at least by the factor 2.

6. The phase-locked loop according to claim 4, wherein the intrinsic noise component of the phase-locked loop is smaller than the intrinsic noise component of the freewheeling oscillator at least by the factor 2.

7. The phase-locked loop according to claim 4, wherein the intrinsic noise component of the phase-locked loop is smaller than the intrinsic noise component of the freewheeling oscillator at least by the factor 10.

8. The phase-locked loop according to claim 4, wherein the intrinsic noise component of the phase-locked loop is smaller than the intrinsic noise component of the freewheeling oscillator at least by the factor 20.

9. The phase-locked loop according to claim 4, wherein the intrinsic noise component of the phase-locked loop is smaller than the intrinsic noise component of the freewheeling oscillator at least by the factor 100.

10. The phase-locked loop according to claim 1, wherein the phase noise of the phase-locked loop for frequencies above the mechanical resonant frequency of the varactor falls by at least 20 decibels per decade.

11. The phase-locked loop according to claim 1,
wherein the phase noise of the phase-locked loop is constant for frequencies below the mechanical resonant frequency of the MEMS-varactor.

12. The phase-locked loop according to claim 1,
wherein a titanium nitride layer is applied on or under the movable membrane.

13. The phase-locked loop according to claim 1,
wherein the control bandwidth is larger than the mechanical resonant frequency at least by the factor 5.

14. The phase-locked loop according to claim 1,
wherein the control bandwidth is larger than the mechanical resonant frequency at least by the factor 10.

15. The phase-locked loop according to claim 1,
wherein the control bandwidth is larger than the mechanical resonant frequency at least by the factor 50.

16. The phase-locked loop according to claim 1,
wherein the phase noise of the phase-locked loop for frequencies above the mechanical resonant frequency of the MEMS-varactor falls by at least 60 decibels per decade.

* * * * *